(12) United States Patent
Toyoda

(10) Patent No.: US 10,651,423 B2
(45) Date of Patent: May 12, 2020

(54) DISPLAY DEVICE

(71) Applicant: Japan Display Inc., Minato-ku (JP)

(72) Inventor: Hironori Toyoda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/397,354

(22) Filed: Apr. 29, 2019

(65) Prior Publication Data

US 2019/0348637 A1 Nov. 14, 2019

(30) Foreign Application Priority Data

May 11, 2018 (JP) .................. 2018-091992

(51) Int. Cl.
*H01L 51/52* (2006.01)
*H01L 51/50* (2006.01)
*H01L 27/32* (2006.01)

(52) U.S. Cl.
CPC ........ *H01L 51/5265* (2013.01); *H01L 51/504* (2013.01); *H01L 51/5012* (2013.01); *H01L 51/5044* (2013.01); *H01L 51/5064* (2013.01); *H01L 51/5218* (2013.01); *H01L 27/3211* (2013.01); *H01L 27/3244* (2013.01); *H01L 51/5253* (2013.01); *H01L 2251/5315* (2013.01)

(58) Field of Classification Search
CPC combination set(s) only.
See application file for complete search history.

(56) References Cited

U.S. PATENT DOCUMENTS

2015/0108446 A1* 4/2015 Ando .................. H01L 51/5265
257/40
2015/0221895 A1 8/2015 Sato et al.

FOREIGN PATENT DOCUMENTS

JP     2015-069956     4/2015

* cited by examiner

*Primary Examiner* — Feifei Yeung Lopez
(74) *Attorney, Agent, or Firm* — Oblon, McClelland, Maier & Neustadt, L.L.P.

(57) ABSTRACT

The first surface includes a contact area in contact with one of the pixel electrodes. The electroluminescence layer includes a separate layer, the separate layer having sections separated from each other. The separate layer at each of the sections has a first portion and a second portion thinner than the first portion, the first portion overlapping with a central portion of the contact area, the second portion overlapping with an edge portion of the contact area. At least one of the electroluminescence layer and the cap layer has a basis layer and an adjustment layer overlapping with each other, the basis layer continuously overlapping with the first portion and the second portion, the adjustment layer overlapping with the second portion without overlapping with a part of the first portion.

12 Claims, 11 Drawing Sheets

FIG.7
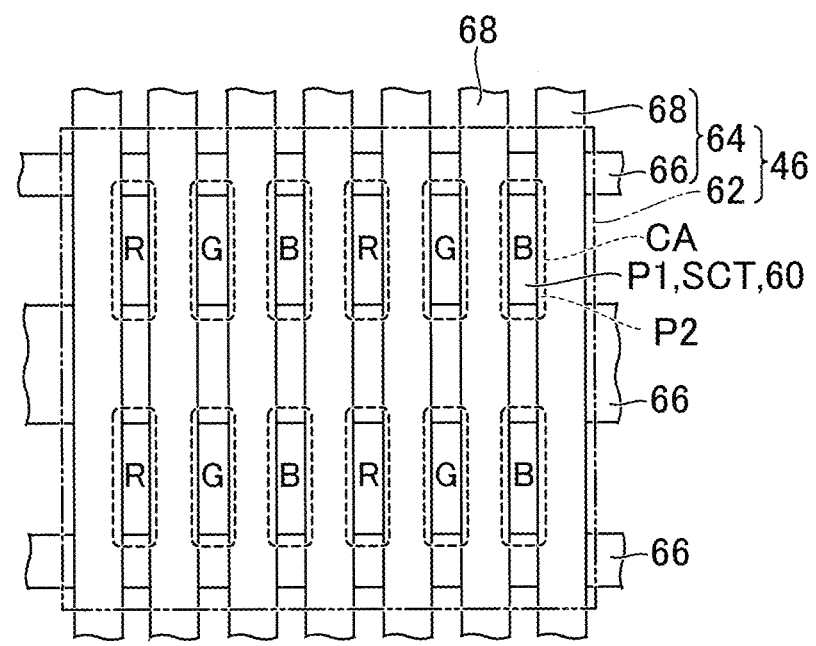
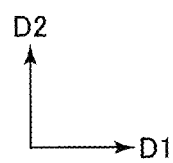

DISPLAY DEVICE

CROSS-REFERENCE TO RELATED APPLICATION

The present application claims priority from Japanese application JP2018-91992 filed on May 11, 2018, the content of which is hereby incorporated by reference into this application.

BACKGROUND OF THE INVENTION

1. Field of the Invention

This relates to display devices.

2. Description of the Related Art

An organic electroluminescence display may have light-emitting layers different in color for respective pixels (JP 2015-69956A). Such light-emitting layers have its pattern formed by vapor deposition using a mask. Vapor deposition materials form a film with a thin portion near an opening of the mask, due to its little adhesion to a substrate. This makes each light-emitting layer uneven in thickness for a corresponding pixel.

The light-emitting layers vary in brightness of light depending on their thickness. With an optical resonance device in a structure, resonator lengths vary due to difference in thickness of the light-emitting layers, and wavelengths of constructive interference vary, thereby changing hues of light. Among hues, brightness, and chromas, three elements of color, specifically, the hues have a large impact on image quality when changed. Even a hole transport layer may vary in thickness, as long as it is formed by the vapor deposition using the mask.

SUMMARY OF THE INVENTION

This is to aim at minimizing changes in emission color.

A display device includes pixel electrodes; an electroluminescence layer having a first surface facing the pixel electrodes and a second surface opposite to the first surface; a counter electrode on the second surface; and a cap layer having a third surface on the counter electrode and a fourth surface opposite to the third surface. The first surface includes a contact area in contact with one of the pixel electrodes. The electroluminescence layer includes a separate layer, the separate layer having sections separated from each other. The separate layer at each of the sections has a first portion and a second portion thinner than the first portion, the first portion overlapping with a central portion of the contact area, the second portion overlapping with an edge portion of the contact area. At least one of the electroluminescence layer and the cap layer has a basis layer and an adjustment layer overlapping with each other, the basis layer continuously overlapping with the first portion and the second portion, the adjustment layer overlapping with the second portion without overlapping with a part of the first portion.

The second portion, which is thinner than the first portion, overlaps with the adjustment layer. This minimizes changes in emission color, due to adjustment of resonator length by the central portion and the edge portion of the contact area.

BRIEF DESCRIPTION OF THE DRAWINGS

FIG. 7 is a detailed plan view of a basis layer and an adjustment layer.

DETAILED DESCRIPTION OF THE INVENTION

Figure 1:
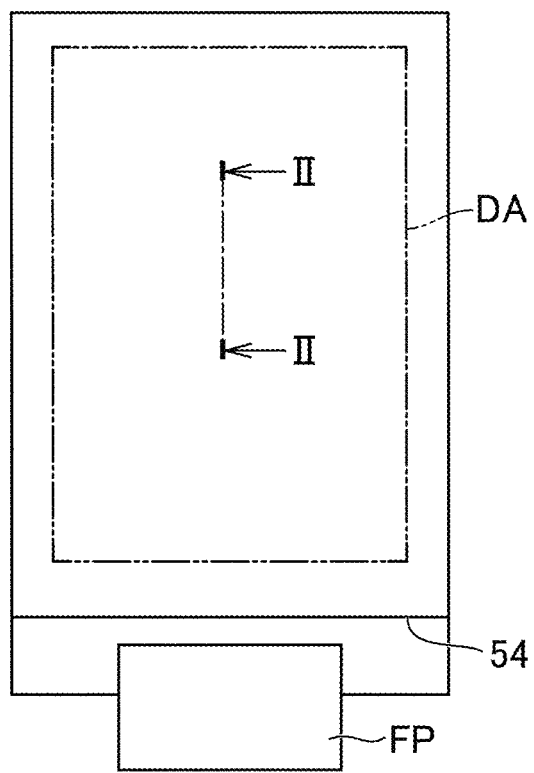
FIG. 1 is a plan view of a display device in a first embodiment.

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

First Embodiment

FIG. 1 is a plan view of a display device in a first embodiment. The display device may be an organic electroluminescence display device. The display device has a display area DA for displaying images. The display area DA displays a full-color image by forming full-color pixels, each of which consists of unit pixels (subpixels) in some colors such as red, green, and blue. The display device, outside the display area DA, is connected to a flexible printed circuit board FP. An integrated circuit chip (not shown) may be mounted on the flexible printed circuit board FP for driving an element to display images.

Figure 2:
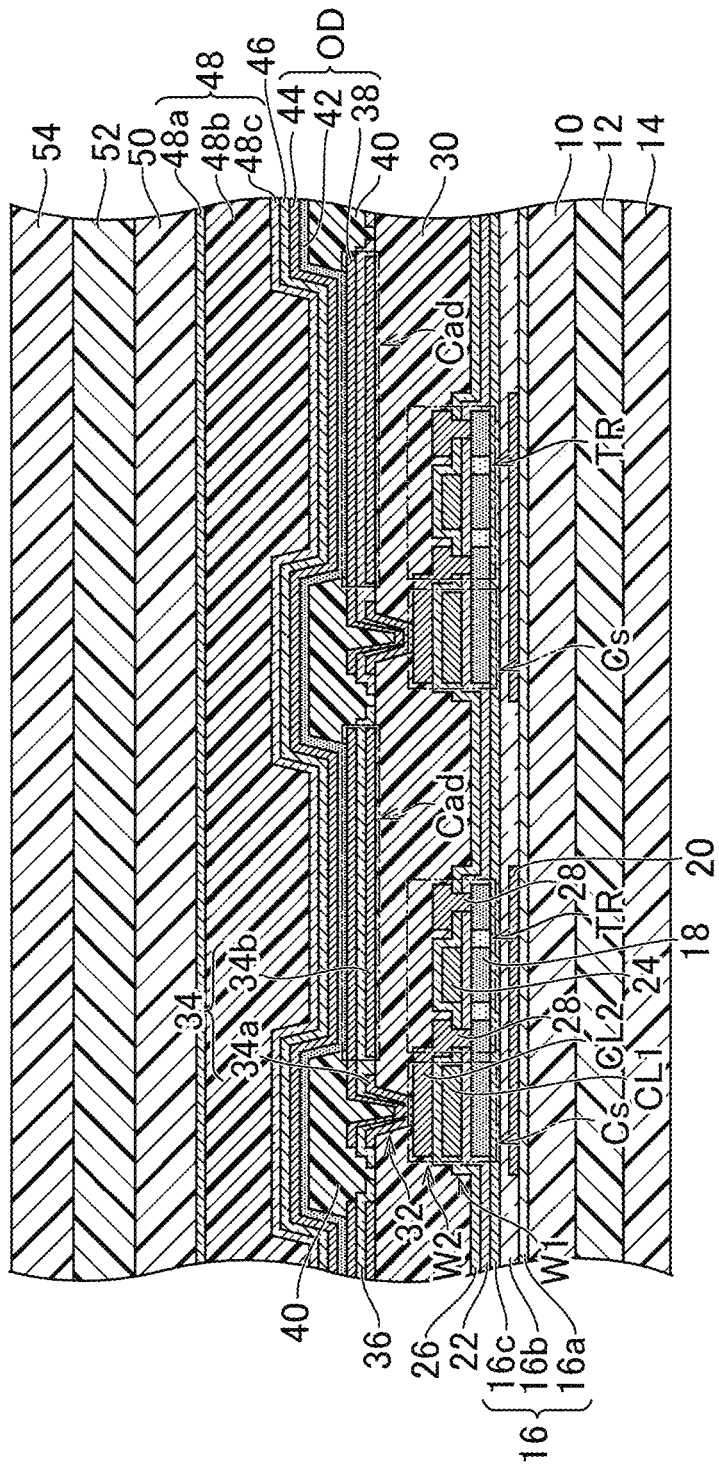
FIG. 2 is a II-II line cross sectional view of the display device in FIG. 1.

FIG. 2 is a II-II line cross sectional view of the display device in FIG. 1. The resin substrate 10 is made from polyimide. Or, other resin materials can be used as long as the materials have satisfactory flexibility for a sheet display or a flexible display. A reinforcing film 14 is put on a back of the resin substrate 10 with a pressure-sensitive adhesive 12 interposed therebetween.

A barrier inorganic film 16 (undercoat layer) is laminated on the resin substrate 10. The barrier inorganic film 16 has a three-layer laminated structure of a silicon oxide film 16a, a silicon nitride film 16b, and a silicon oxide film 16c. The silicon oxide film 16a of the lowest layer is for improving close-fitting properties with the resin substrate 10; the silicon nitride film 16b of the middle layer is for a blocking film from external moisture and impurities; and the silicon oxide film 16c of the uppermost layer is another blocking film to prevent hydrogen atoms in the silicon nitride film 16b from diffusing on a side of a semiconductor layer 18 of a thin film transistor TR. Such a structure, however, is not essential. Another layer or a two-layer laminate is applicable thereto.

An additional film 20 may be formed corresponding to an area where the thin film transistor TR is formed. The additional film 20 may curb characteristic changes of the thin film transistor TR due to light intrusion from its channel back or may provide the thin film transistor TR with a backgating effect by being formed from a conductive material to apply a certain potential. In the embodiment, after the silicon oxide film 16a is formed, the additional film 20 is formed in an island shape corresponding to the area where the thin film transistor TR is formed, and then the silicon nitride film 16b and the silicon oxide film 16c are laminated, whereby the additional film 20 is sealed in the barrier inorganic film 16. Alternatively, the additional film 20 may be formed on the resin substrate 10, prior to forming the barrier inorganic film 16.

The thin film transistor TR is on the barrier inorganic film 16. A polysilicon thin film transistor is illustrated and only an N-ch transistor is herein shown but a P-ch transistor may be simultaneously formed. The semiconductor layer 18 in the thin film transistor TR has a structure where a low-concentration impurity area is provided between a channel area and a source/drain area. A silicon oxide film is herein used for a gate insulating film 22. A gate electrode 24 is a part of a first wiring layer W1 made from MoW. The first wiring layer W1 includes a first storage capacitor line CL1 in addition to the gate electrode 24. A part of a storage capacitor Cs is formed between the first storage capacitor line CL1 and the semiconductor layer 18 (source/drain area) with the gate insulating film 22 interposed therebetween.

An interlayer insulating film 26 (silicon oxide film and silicon nitride film) is on the gate electrode 24. A second wiring layer W2, which includes portions for the source/drain electrode 28, is on the interlayer insulating film 26. A three-layer laminated structure made from Ti, Al, and Ti is used as the source/drain electrode 28. The first storage capacitor line CL1 (part of the first wiring layer W1) and a second storage capacitor line CL2 (part of the second wiring layer W2) constitute another portion of the storage capacitor Cs, with the interlayer insulating film 26 interposed therebetween.

A flattening organic layer 30 covers the source/drain electrode 28. Resins such as photosensitive acryl are used for the flattening organic layer 30 because of superior surface flatness, compared with inorganic insulation materials formed by chemical vapor deposition (CVD). The flattening organic layer 30 is removed at a pixel contact portion 32 and has an indium tin oxide (ITO) film 34 formed thereon. The indium tin oxide film 34 includes a first transparent conductive film 34a and a second transparent conductive film 34b separated from each other.

The second wiring layer W2, which has its surface exposed by removing the flattening organic layer 30, is covered with the first transparent conductive film 34a. A silicon nitride film 36 is on the flattening organic layer 30, covering the first transparent conductive film 34a. The silicon nitride film 36 has an opening at the pixel contact portion 32. A pixel electrode 38 is laminated on and connected to the source/drain electrode 28 through the opening. The pixel electrode 38 extends laterally from the pixel contact portion 32 to above the thin film transistor TR.

The display device has a plurality of pixel electrodes 38. The second transparent conductive film 34b is adjacent to the pixel contact portion 32 and under the pixel electrode 38 (further below the silicon nitride film 36). The second transparent conductive film 34b, the silicon nitride film 36, and the pixel electrode 38 overlap with one another, thereby forming an additional capacitance Cad.

An insulation layer 40, which is called a bank (rib) for a partition of adjacent pixel areas, is on the flattening organic layer 30 and over the pixel contact portion 32, for example. Photosensitive acrylic may be used for the insulation layer 40 as with the flattening organic layer 30. The insulation layer 40 has an opening for exposing a surface of the pixel electrode 38 as a light-emitting region. The opening should have an edge in a gently declined shape. A steep shape of the opening edge may cause insufficient coverage of an electroluminescence layer 42 formed thereon.

The flattening organic layer 30 and the insulation layer 40 are in contact with each other through an opening in the silicon nitride film 36 between them. This makes it possible to remove moisture and gas desorbed from the flattening organic layer 30 through the insulation layer 40 during heat treatment after the insulation layer 40 is formed.

An electroluminescence layer 42, made from organic materials, for example, is laminated on the pixel electrode 38. A counter electrode 44 is on the electroluminescence layer 42. Due to a top emission structure employed herein, the counter electrode 44 is transparent. An Mg layer and an Ag layer may be formed to be as thin a film as outgoing light from the electroluminescence layer 42 can pass. In the forming order of the electroluminescence layer 42, the pixel electrode 38 is an anode, and the counter electrode 44 is a cathode. The plurality of pixel electrodes 38, the counter electrode 44, and the electroluminescence layer 42 between central portions of the respective pixel electrodes 38 and the counter electrode 44 constitute light-emitting elements OD.

A cap layer 46 is laminated on the counter electrode 44 for improving light-extraction efficiency. A sealing layer 48 is on the cap layer 46. The sealing layer 48 may serve to prevent external moisture intrusion into the electroluminescence layer 42 formed thereunder, requiring high gas barrier properties. The sealing layer 48 has a laminate structure where a sealing organic layer 48b is interposed between a pair of sealing inorganic films 48a, 48c (e.g. silicon nitride films) thereover and thereunder. The pair of sealing inorganic films 48a, 48c are configured to be in contact with and overlap with each other around the sealing organic layer 48b. A silicon oxide film or an amorphous silicon layer may be formed between the sealing inorganic film 48a or 48c and the sealing organic layer 48b, for improving close-fitting properties. A reinforcing organic layer 50 is laminated on the sealing layer 48. A polarizing plate 54 is attached to the reinforcing organic layer 50 with an adhesive layer 52 interposed therebetween. The polarizing plate 54 may be a circularly polarizing plate.

Figure 3:
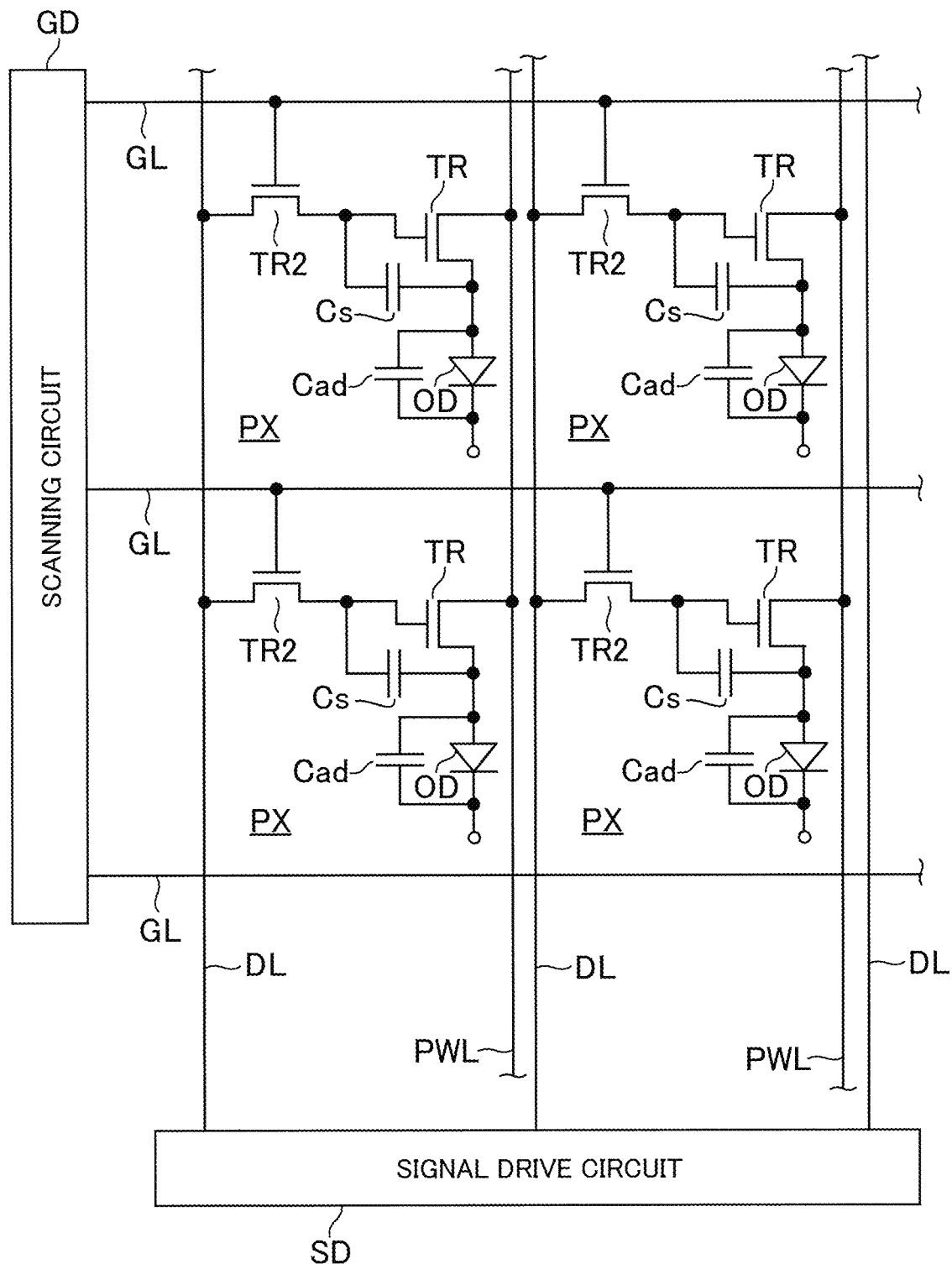
FIG. 3 is a circuit diagram of the display device in FIG. 1.

FIG. 3 is a circuit diagram of the display device in FIG. 1. The circuit includes a plurality of scan lines GL connected to a scanning circuit GD and a plurality of signal lines DL connected to a signal drive circuit SD. A pixel PX is an area surrounded by adjacent two scan lines GL and adjacent two signal lines DL. The pixel PX has the thin film transistor TR as a drive transistor, a thin film transistor TR2 as a switch, a storage capacitor Cs, and an additional capacitance Cad. By applying gate voltage to the scan line GL, the thin film transistor TR2 is turned ON, whereby a video signal is supplied from the signal line DL, and charge is stored in the storage capacitor Cs and the additional capacitance Cad. By storing the charge in the storage capacitor Cs, the thin film transistor TR is turned ON, passing a current from a power line PWL to the light-emitting element OD. With the current, the light-emitting element OD emits light.

Figure 4:
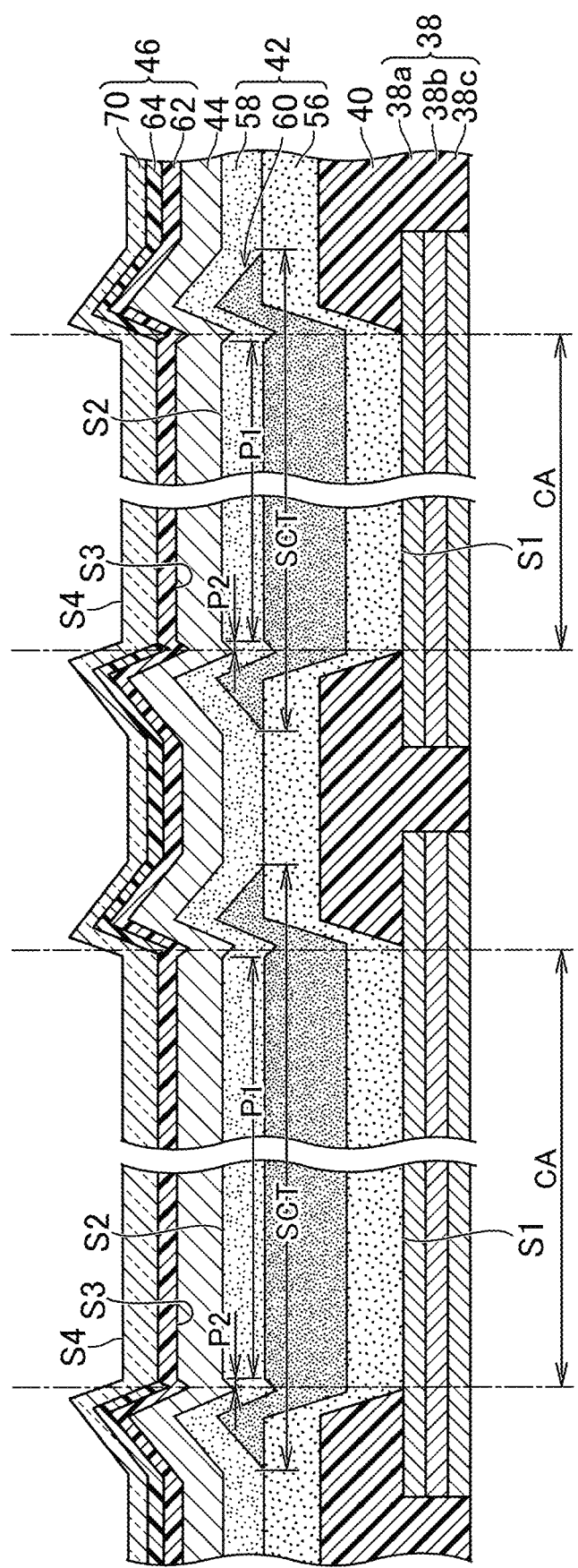
FIG. 4 is a detail view of a pixel electrode and an electroluminescence layer.

FIG. 4 is a detail view of the pixel electrode 38 and the electroluminescence layer 42. The pixel electrode 38 has a three-layer laminated structure of a transparent conductive film 38a (e.g. ITO film), a reflective layer 38b (e.g. Ag film), and a transparent conductive film 38c (e.g. ITO film). Instead of the ITO film, an indium tin oxide (IZO) film may be used. The light generated in the electroluminescence layer 42 passes through the transparent conductive film 38a and reflects on the reflective layer 38b. The transparent conductive film 38a serves to inject holes in the electroluminescence layer 42, making it preferable to be selectively made from oxide conductive materials such as ITO and IZO, with large work function. The insulation layer 40 has an overlapping portion on an edge portion of each pixel electrode 38, except for overlapping with a central portion of the pixel electrode 38.

The electroluminescence layer 42 has a first surface S1 in contact with the plurality of pixel electrodes 38. The first surface S1 includes a plurality of contact areas CA in contact with the respective pixel electrodes 38. Each contact area CA is in contact with an area where a corresponding one of the pixel electrodes 38 is exposed from the insulation layer 40. The electroluminescence layer 42 has a second surface S2 opposite to the first surface S1. The counter electrode is in contact with the second surface S2 of the electroluminescence layer 42. The electroluminescence layer 42 has a first continuous layer 56 including the first surface S1 and a second continuous layer 58 including the second surface S2. The first continuous layer 56 and the second continuous layer 58 are continuously formed all over the display area DA in FIG. 1.

Figure 5:
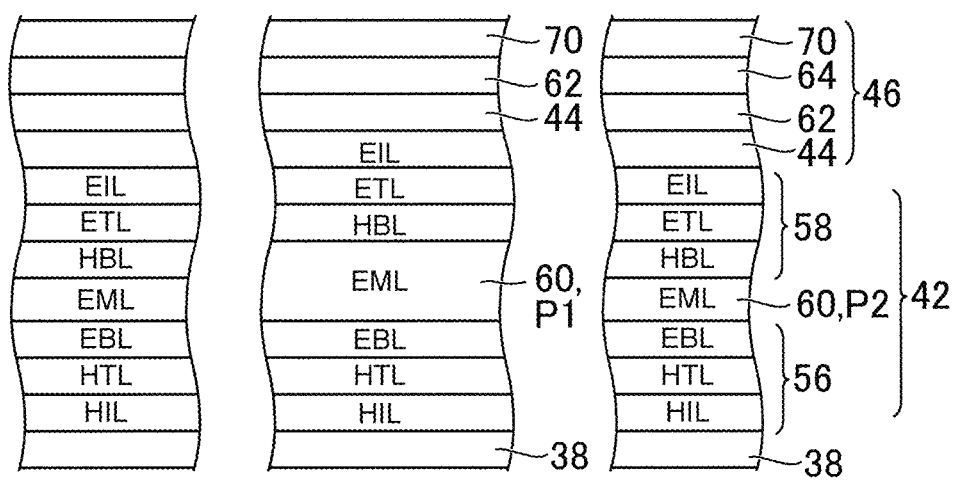
FIG. 5 is a detail view of the electroluminescence layer.

FIG. 5 is a detail view of the electroluminescence layer 42. A hole injection layer HIL, a hole transport layer HTL, and an electron blocking layer EBL are laminated in an order upward from the pixel electrode 38 as the anode, constituting a first continuous layer 56. An electron injection layer EIL, an electron transport layer ETL, and a hole blocking layer HBL are laminated in an order downward from the counter electrode 44 as the cathode, constituting a second continuous layer 58.

The electroluminescence layer 42 includes a separate layer 60 between the first continuous layer 56 and the second continuous layer 58. FIG. 4 illustrates that the separate layer 60 includes a plurality of sections SCT separated corresponding to the pixel electrodes 38. The separate layer 60 is a light-emitting layer EML. Each section SCT has a first portion P1. The first portion P1 overlaps with a central portion of the contact area CA. Each section SCT has a second portion P2. The second portion P2 overlaps with an edge portion of the contact area CA. The second portion P2 is thinner than the first portion P1.

Figure 6:
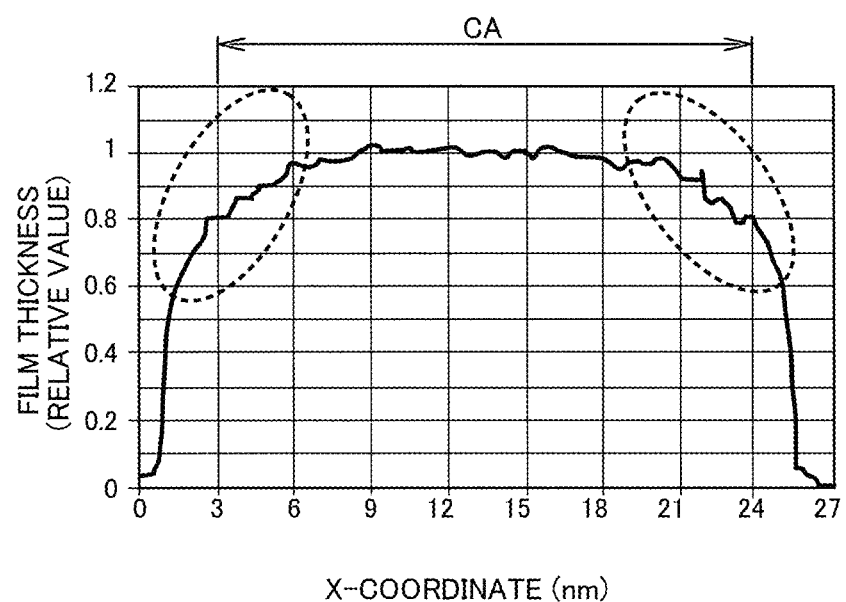
FIG. 6 is a diagram showing film thickness of a separate layer.

FIG. 6 is a diagram showing film thickness of the separate layer 60. The separate layer 60 (light-emitting layer EML) is formed by vapor deposition using a mask which is not illustrated. The mask has an opening, near which vapor deposition materials are difficult to accumulate, whereby the first portion P1 and the second portion P2 are formed in different thicknesses, as shown in FIG. 4. In FIG. 6, the opening of the mask is as wide as a range of 0-27 nm in an x-coordinate, with the film thickness smaller near peripheries of the opening. The thickness of the separate layer 60 is thin on and inside the edge of the contact area CA, forming a dent near the edge of the contact area CA on an upper surface of the separate layer 60 (light-emitting layer EML), as shown in FIG. 4.

FIG. 4 illustrates that the counter electrode 44 laminated on the electroluminescence layer 42 also has a dent near the edge of the contact area CA. The cap layer has a third surface S3 on a side of the counter electrode 44. The cap layer 46 has a fourth surface S4 opposite to the third surface S3. The cap layer 46 improves light-extraction efficiency and displays images on the fourth surface S4.

At least one (e.g. cap layer 46) of the electroluminescence layer 42 and the cap layer 46 includes a basis layer 62, which continuously overlaps with the first portion P1 and the second portion P2. At least one of the electroluminescence layer 42 and the cap layer 46 includes an adjustment layer 64, which overlaps with the second portion P2, without overlapping with the first portion P1. The basis layer 62 is in contact with and overlaps with the adjustment layer 64. In this embodiment, the cap layer 46 includes the adjustment layer 64. The layer consisting of the basis layer 62 and the adjustment layer 64 is thicker above the second portion P2 than above the first portion P1. The cap layer 46 includes the basis layer 62 and the adjustment layer 64. The basis layer 62 and the adjustment layer 64 are made from the same material (e.g. organic material).

FIG. 7 is a detailed plan view of the basis layer and the adjustment layer 64. The basis layer 62 is continuously formed all over the display area DA in FIG. 1. The adjustment layer 64 includes some first stripe layers 66 extending in a first direction D1. The adjustment layer 64 includes some second stripe layers 68 extending in a second direction D2 crossing the first direction D1. The cap layer 46 is thicker at positions of the first stripe layer 66 and the second stripe layer 68. The central portion of the contact area CA and the first portion P1 of the separate layer 60 (section SCT) are between adjacent two first stripe layers 66 and between adjacent two second stripe layers 68.

FIG. 4 shows that the cap layer 46 further includes an inorganic layer 70. The adjustment layer 64 is interposed between the basis layer 62 and the inorganic layer 70. The basis layer 62 has the third surface S3. The inorganic layer 70 has the fourth surface S4. The light generated in the electroluminescence layer 42 resonates at least between the first surface S1 and the fourth surface S4. The light reflects on the reflective layer 38b, for example. The display device is equipped with a resonator. In the embodiment, the adjustment layer 64 overlaps with the second portion P2 thinner than the first portion P1, whereby the central portion and the edge portion of the contact area CA contribute to adjustment of resonator length, curbing emission color changes.

Figure 8:
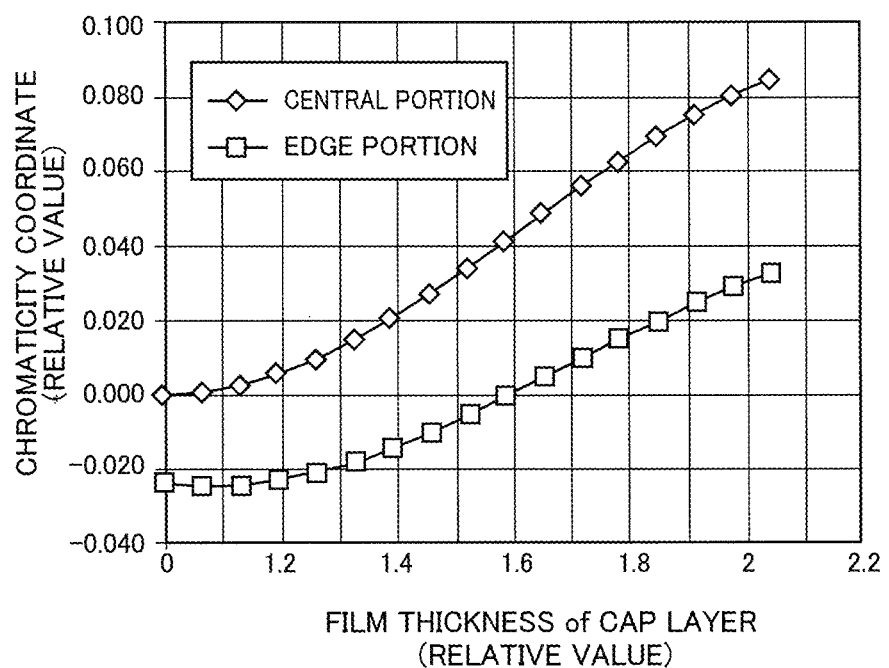
FIG. 8 is a diagram showing relation between film thickness of a cap layer and a chromaticity coordinate.

FIG. 8 is a diagram showing relation between film thickness of the cap layer 46 and a chromaticity coordinate. Equivalence of the cap layer 46 in film thickness is referred to as 1. With the cap layer 46 equivalent in film thickness, the central portion of the contact area CA has its chromaticity coordinate 0.000, which is the designed value. With the cap layer 46 equivalent in film thickness, the light-emitting layer EML (separate layer 60) is thinner at the edge portion of the contact area CA than at the central portion, whereby the chromaticity coordinate deviates from the designed value. In the embodiment, as mentioned above, the cap layer 46 has a thick portion. With the cap layer 46 made 1.6, the chromaticity coordinate, at the edge portion of the contact area CA as well, is almost the designed value (0.000).

Second Embodiment

Figure 9:
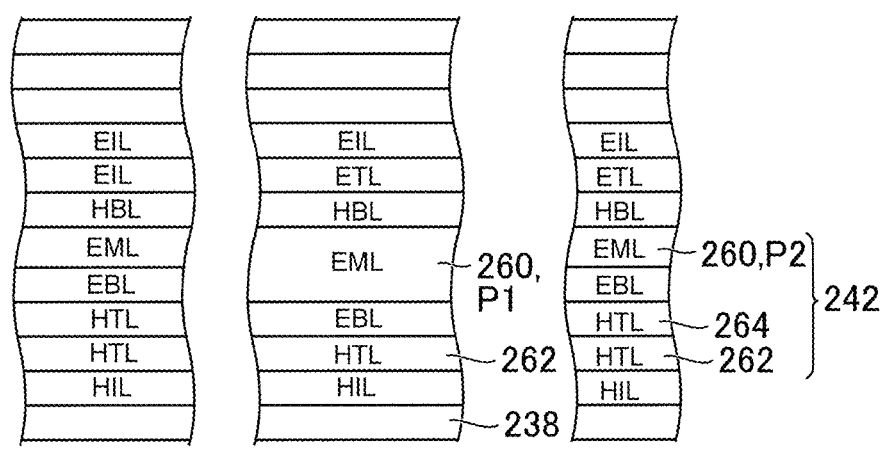
FIG. 9 is a detailed view of the electroluminescence layer in a second embodiment.

FIG. 9 is a detailed view of the electroluminescence layer in a second embodiment. In the embodiment, the electroluminescence layer 242 includes the basis layer 262 and the adjustment layer 264.

The hole injection layer HIL is laminated on the pixel electrodes 238, which are the anodes, all over the display area DA in FIG. 1. The hole transport layer HTL, laminated on the hole injection layer HIL, includes the basis layer 262 and the adjustment layer 264. The basis layer 262 is continuously formed all over the display area DA in FIG. 1. The adjustment layer 264 overlaps with the edge portion (second portion P2), except for the central portion (first portion P1), of the contact area CA in FIG. 10.

Figure 10:
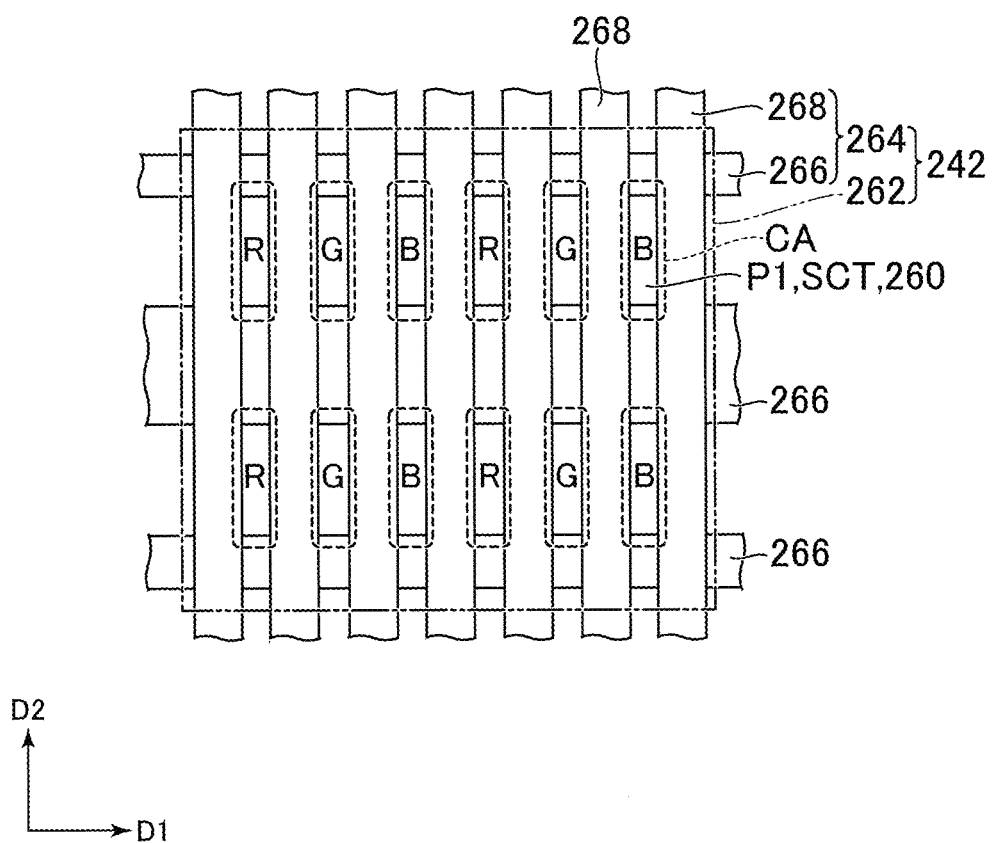
FIG. 10 is a detailed plan view of a basis layer and an adjustment layer.

FIG. 10 is a detailed plan view of the basis layer 262 and the adjustment layer 264. The basis layer 262 is continuously formed all over the display area DA in FIG. 1. The adjustment layer 264 includes the first stripe layers 266 extending in the first direction D1. The adjustment layer 264 includes the second stripe layers 268 extending in the second direction D2 crossing the first direction D1. The first stripe layer 266 and the second stripe layer 268 contribute to greater thickness of the hole transport layer HTL. The thicker portion is under the thinner second portion P2 of the light-emitting layer EML (separate layer 260). The central portion of the contact area CA and the first portion P1 of the separate layer 260 (section SCT) are between adjacent two first stripe layers 266 and between adjacent two second stripe layers 268.

Figure 11:
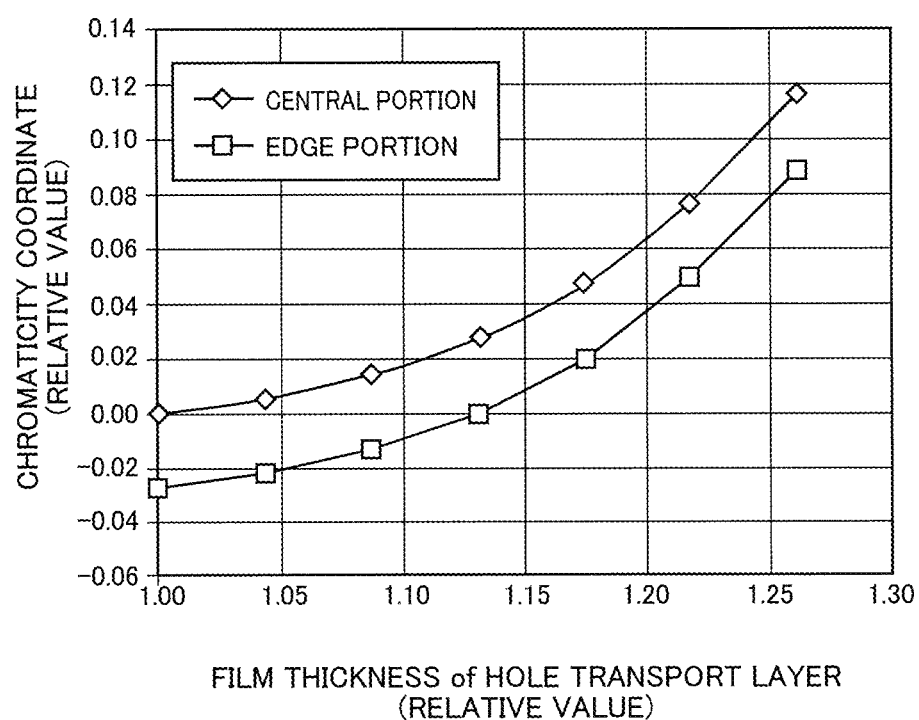
FIG. 11 is a diagram showing relation between film thickness of a hole transport layer and a chromaticity coordinate.

FIG. 11 is a diagram showing relation between film thickness of the hole transport layer HTL and the chromaticity coordinate. Equivalence in film thickness of the hole transport layer HTL is referred to as 1.00. With the hole transport layer HTL equivalent in film thickness, the central portion of the contact area CA has its chromaticity coordinate 0.00, which is the designed value. With the hole transport layer HTL equivalent in film thickness, the light-emitting layer EML (separate layer 260) is thinner at the edge portion of the contact area CA than at the central portion, whereby the chromaticity coordinate deviates. In the embodiment, as mentioned above, the hole transport layer HTL has a thicker portion. With the hole transport layer HTL made 1.13, the chromaticity coordinate, at the edge portion of the contact area CA as well, is almost the designed value (0.00).

The electronic device is not limited to the organic electroluminescence display device but may be a display device with a light emitting element disposed in each pixel, such as a quantum-dot light emitting diode (QLED), or a liquid crystal display device.

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
   pixel electrodes;
   an electroluminescence layer having a first surface facing the pixel electrodes and a second surface opposite to the first surface;
   a counter electrode on the second surface; and
   a cap layer having a third surface on the counter electrode and a fourth surface opposite to the third surface, wherein
   the first surface includes a contact area in contact with one of the pixel electrodes,
   the electroluminescence layer includes a separate layer, the separate layer having sections separated from each other,
   the separate layer at each of the sections has a first portion and a second portion thinner than the first portion, the first portion overlapping with a central portion of the contact area, the second portion overlapping with an edge portion of the contact area, and
   at least one of the electroluminescence layer and the cap layer has a basis layer and an adjustment layer overlapping with each other, the basis layer continuously overlapping with the first portion and the second portion, the adjustment layer overlapping with the second portion without overlapping with a part of the first portion.

2. The display device according to claim 1, wherein the separate layer is a light-emitting layer.

3. The display device according to claim 1, wherein
   the adjustment layer includes some first stripe layers extending in a first direction and some second stripe layers extending in a second direction crossing the first direction, and
   the central portion and the first portion are between an adjacent pair of the first stripe layers and between an adjacent pair of the second stripe layers.

4. The display device according to claim 1, wherein the cap layer includes the basis layer and the adjustment layer.

5. The display device according to claim 4, wherein the basis layer and the adjustment layer are made from an organic material.

6. The display device according to claim 5, wherein the cap layer further includes an inorganic layer.

7. The display device according to claim 6, wherein
   the adjustment layer is interposed between the basis layer and the inorganic layer,
   the basis layer has the third surface, and
   the inorganic layer has the fourth surface.

8. The display device according to claim 1, wherein the electroluminescence layer includes the basis layer and the adjustment layer.

9. The display device according to claim 8, wherein the basis layer and the adjustment layer are a hole transport layer.

10. The display device according to claim 1, further comprising an insulation layer having a portion on an edge portion, except for a central portion, of each of the pixel electrodes,
    wherein the contact area is in contact with one of the pixel electrodes in an area being exposed from the insulation layer.

11. The display device according to claim 1, wherein
    each of the pixel electrodes includes a reflective layer, and the light reflects on the reflective layer.

12. The display device according to claim 1, wherein the basis layer and the adjustment layer are made from same material.

* * * * *